(12) United States Patent
Andrews

(10) Patent No.: US 10,094,523 B2
(45) Date of Patent: Oct. 9, 2018

(54) LED ASSEMBLY

(71) Applicant: Cree, Inc., Durham, NC (US)

(72) Inventor: Peter Andrews, Durham, NC (US)

(73) Assignee: Cree, Inc., Durham, NC (US)

( * ) Notice: Subject to any disclaimer, the term of this patent is extended or adjusted under 35 U.S.C. 154(b) by 1023 days.

(21) Appl. No.: 13/866,587

(22) Filed: Apr. 19, 2013

(65) Prior Publication Data

US 2014/0313713 A1    Oct. 23, 2014

(51) Int. Cl.
*F21K 9/90* (2016.01)
*F21S 4/10* (2016.01)
(Continued)

(52) U.S. Cl.
CPC ............... *F21S 4/001* (2013.01); *F21S 4/10* (2016.01); *F21K 9/232* (2016.08); *F21K 9/233* (2016.08);
(Continued)

(58) Field of Classification Search
CPC ......... H01L 33/62; H01L 24/48; H01L 33/52; H01L 33/60; H01L 2224/73265; H01L 2224/73257; H01L 2224/48227; H01L 24/45; H01L 25/073; H01L 2924/12041; F21Y 2101/02; F21Y 2111/001; F21Y 2103/003; F21Y 2113/005; F21Y 2105/001; F21Y 2103/10; F21Y 2115/10; F21Y 2105/10; F21K 9/00; F21K 9/13; F21K 9/135; F21K 9/56; F21K 9/20; F21K 9/60; F21K 9/62; F21K 9/64; F21K 9/90; F21K 9/232; F21K 9/275; F21K 9/235; F21K 9/238; F21S 4/001; F21S 4/10; F21S 4/20; F21S 4/22; F21S 4/26; F21S 4/28; F21S 8/061; F21S 4/15; F21S 4/00; F21S 48/328; F21S 48/215; F21S 48/218; A44C 15/0015; F21V 17/12; F21V 19/0035; F21V 29/02; F21V 29/506; F21V 29/58; F21V 23/002; F21V 29/004; F21V 29/50; F21V 29/51; F21V 19/001; F21V 3/00; F21V 17/10; F21V 23/005; F21V 29/70
USPC ..... 362/184, 217.01, 217.13, 222, 223, 231, 362/235, 240, 249.01, 249.02, 249.04, 362/249.06, 249.14, 311.01, 311.02, 363
See application file for complete search history.

(56) References Cited

U.S. PATENT DOCUMENTS

| 3,581,162 | A |   | 5/1971 | Wheatley |        |
|-----------|---|---|--------|----------|--------|
| 4,161,021 | A | * | 7/1979 | George, Jr. | H01K 7/06 |
|           |   |   |        |          | 362/235 |

(Continued)

FOREIGN PATENT DOCUMENTS

| EP | 1058221 A2 | 12/2000 |
| EP | 0890059 B1 | 6/2004 |

(Continued)

OTHER PUBLICATIONS

U.S. Appl. No. 15/591,646, Office Action, dated Jun. 25, 2018.

*Primary Examiner* — Hargobind S Sawhney
(74) *Attorney, Agent, or Firm* — Dennis J. Williamson; Moore & Van Allen PLLC

(57) ABSTRACT

An LED assembly comprises a string of LEDs. An electrical connector electrically connects the plurality of LEDs and provides the physical support between the LEDs. Lamps incorporating the LED assembly are provided. Methods of making the LED assembly are also provided.

20 Claims, 12 Drawing Sheets

(51) Int. Cl.
*F21S 4/00* (2016.01)
*H01L 33/20* (2010.01)
*F21K 9/232* (2016.01)
*F21K 9/233* (2016.01)

(52) U.S. Cl.
CPC .............. *F21K 9/90* (2013.01); *H01L 33/20* (2013.01); *H01L 2224/4554* (2013.01); *H01L 2224/48139* (2013.01); *H01L 2224/49175* (2013.01); *Y10T 29/49117* (2015.01)

(56) References Cited

U.S. PATENT DOCUMENTS

| | | | |
|---|---|---|---|
| 5,463,280 A | 10/1995 | Johnson | |
| 5,559,681 A * | 9/1996 | Duarte | F21S 4/003 362/231 |
| 5,561,346 A | 10/1996 | Byrne | |
| 5,585,783 A | 12/1996 | Hall | |
| 5,655,830 A | 8/1997 | Ruskouski | |
| 5,672,000 A * | 9/1997 | Lin | F21S 4/001 362/241 |
| 5,688,042 A | 11/1997 | Madadi et al. | |
| 5,806,965 A | 9/1998 | Deese | |
| 5,836,673 A * | 11/1998 | Lo | A41D 13/01 362/103 |
| 5,947,588 A | 9/1999 | Huang | |
| 5,949,347 A | 9/1999 | Wu | |
| 6,220,722 B1 | 4/2001 | Begemann | |
| 6,227,679 B1 | 5/2001 | Zhang et al. | |
| 6,234,648 B1 | 5/2001 | Borner et al. | |
| 6,250,774 B1 | 6/2001 | Begemann et al. | |
| 6,276,822 B1 | 8/2001 | Bedrosian et al. | |
| 6,299,332 B1 * | 10/2001 | Huang | A47G 33/0836 362/235 |
| 6,428,342 B1 * | 8/2002 | Pan | F21S 4/20 362/249.01 |
| 6,465,961 B1 | 10/2002 | Cao | |
| 6,523,978 B1 | 2/2003 | Huang | |
| 6,550,953 B1 | 4/2003 | Ichikawa et al. | |
| 6,634,770 B2 | 10/2003 | Cao | |
| 6,659,632 B2 | 12/2003 | Chen | |
| 6,709,132 B2 | 3/2004 | Ishibashi | |
| 6,803,607 B1 | 10/2004 | Chan et al. | |
| 6,848,819 B1 | 2/2005 | Arndt et al. | |
| 6,864,513 B2 | 3/2005 | Lin et al. | |
| 6,948,829 B2 | 9/2005 | Verdes et al. | |
| 6,982,518 B2 | 1/2006 | Chou et al. | |
| 7,048,412 B2 | 5/2006 | Martin et al. | |
| 7,080,924 B2 | 7/2006 | Tseng et al. | |
| 7,080,926 B2 * | 7/2006 | Chang | 362/249.14 |
| 7,086,756 B2 | 8/2006 | Maxik | |
| 7,086,767 B2 | 8/2006 | Sidwell et al. | |
| 7,144,135 B2 | 12/2006 | Martin et al. | |
| 7,160,140 B1 * | 1/2007 | Mrakovich | F21V 21/002 439/417 |
| 7,165,866 B2 | 1/2007 | Li | |
| 7,172,314 B2 | 2/2007 | Currie et al. | |
| 7,210,957 B2 * | 5/2007 | Mrakovich | F21S 4/001 439/404 |
| 7,213,940 B1 | 5/2007 | Van De Ven et al. | |
| 7,354,174 B1 | 4/2008 | Yan | |
| 7,358,679 B2 | 4/2008 | Lys et al. | |
| 7,396,142 B2 | 7/2008 | Laizure, Jr. et al. | |
| 7,600,882 B1 | 10/2009 | Morejon et al. | |
| 7,690,817 B2 * | 4/2010 | Sanpei | H05K 1/0203 362/249.02 |
| 7,726,836 B2 | 6/2010 | Chen | |
| 7,824,065 B2 | 11/2010 | Maxik | |
| 8,018,139 B2 * | 9/2011 | Chou | 313/503 |
| 8,021,025 B2 | 9/2011 | Lee | |
| 8,253,316 B2 | 8/2012 | Sun et al. | |
| 8,272,762 B2 | 9/2012 | Maxik et al. | |
| 8,274,230 B2 | 9/2012 | Chiu | |
| 8,274,241 B2 | 9/2012 | Guest et al. | |
| 8,277,082 B2 | 10/2012 | Dassanayake et al. | |
| 8,282,250 B1 | 10/2012 | Dassanayake et al. | |
| 8,292,468 B2 | 10/2012 | Narendran et al. | |
| 8,314,566 B2 * | 11/2012 | Steele | F21K 9/135 315/185 R |
| 8,322,896 B2 | 12/2012 | Falicoff et al. | |
| 8,324,790 B1 * | 12/2012 | Hu | F21K 9/135 313/110 |
| 8,371,722 B2 | 2/2013 | Carroll | |
| 8,398,261 B2 * | 3/2013 | Nall | F21S 4/001 315/294 |
| 8,400,051 B2 | 3/2013 | Hakata et al. | |
| 8,415,865 B2 | 4/2013 | Liang et al. | |
| 8,421,320 B2 | 4/2013 | Chuang | |
| 8,421,321 B2 | 4/2013 | Chuang | |
| 8,421,322 B2 | 4/2013 | Carroll et al. | |
| 8,445,927 B2 * | 5/2013 | Joo et al. | 257/98 |
| 8,449,154 B2 | 5/2013 | Uemoto et al. | |
| 8,502,468 B2 | 8/2013 | Li et al. | |
| 8,632,200 B2 * | 1/2014 | Takeuchi | G02F 1/133603 362/311.01 |
| 8,641,237 B2 | 2/2014 | Chuang | |
| 8,653,723 B2 | 2/2014 | Cao et al. | |
| 8,696,168 B2 | 4/2014 | Li et al. | |
| 8,740,415 B2 | 6/2014 | Wheelock | |
| 8,750,671 B1 | 6/2014 | Kelly et al. | |
| 8,752,984 B2 | 6/2014 | Lenk et al. | |
| 8,760,042 B2 | 6/2014 | Sakai et al. | |
| 8,789,988 B2 * | 7/2014 | Goldwater | F21S 4/005 362/217.01 |
| 8,955,996 B2 * | 2/2015 | Ooya | F21V 3/0409 313/498 |
| 8,967,827 B2 * | 3/2015 | Urano | H05K 1/181 362/249.02 |
| 8,998,454 B2 * | 4/2015 | Wang | F21V 19/003 362/249.02 |
| 9,052,067 B2 | 6/2015 | van de Ven et al. | |
| 9,470,380 B2 * | 10/2016 | Cornelissen | H01L 25/0753 |
| 9,557,018 B2 | 1/2017 | Steele et al. | |
| 9,967,943 B1 | 5/2018 | Wang et al. | |
| 9,995,440 B2 | 6/2018 | Edwards | |
| 2003/0063463 A1 * | 4/2003 | Sloan | F21V 21/0808 362/238 |
| 2004/0062041 A1 * | 4/2004 | Cross | F21K 9/17 362/240 |
| 2004/0115984 A1 * | 6/2004 | Rudy | F21V 21/002 439/405 |
| 2004/0201990 A1 | 10/2004 | Meyer | |
| 2004/0223328 A1 * | 11/2004 | Lee | B60Q 1/2607 362/249.01 |
| 2005/0047115 A1 * | 3/2005 | Lin | F21S 4/20 362/104 |
| 2005/0105291 A1 * | 5/2005 | Wu | F21S 4/001 362/294 |
| 2006/0137395 A1 * | 6/2006 | Kamara | A44C 15/0015 63/3 |
| 2007/0091598 A1 * | 4/2007 | Chen | F21V 29/00 362/231 |
| 2007/0263385 A1 * | 11/2007 | Fan | F21S 4/007 362/249.16 |
| 2007/0267976 A1 * | 11/2007 | Bohler | B82Y 10/00 315/112 |
| 2008/0151538 A1 * | 6/2008 | Huang | F21V 23/04 362/231 |
| 2008/0232103 A1 * | 9/2008 | Nall | F21S 4/001 362/249.01 |
| 2009/0129099 A1 * | 5/2009 | Fan | F21V 31/00 362/368 |
| 2009/0184618 A1 | 7/2009 | Hakata et al. | |
| 2010/0135024 A1 * | 6/2010 | Gier | F21S 4/001 362/294 |
| 2010/0181888 A1 * | 7/2010 | Lu | F21V 29/02 313/46 |
| 2010/0188844 A1 * | 7/2010 | Dubois | 362/184 |
| 2010/0232168 A1 * | 9/2010 | Horng | F21K 9/1355 362/373 |

(56) References Cited

U.S. PATENT DOCUMENTS

| | | | | |
|---|---|---|---|---|
| 2011/0267812 | A1* | 11/2011 | Van De Ven | F21K 9/00 362/235 |
| 2012/0007492 | A1* | 1/2012 | Hussell | F21K 9/00 313/488 |
| 2012/0040585 | A1 | 2/2012 | Huang | |
| 2012/0042512 | A1* | 2/2012 | Bisberg | H01L 33/58 29/832 |
| 2012/0126257 | A1* | 5/2012 | Reiherzer | H01L 25/0753 257/88 |
| 2012/0161626 | A1* | 6/2012 | van de Ven | F21V 7/0016 315/35 |
| 2012/0268938 | A1* | 10/2012 | Peng | F21V 17/12 362/249.06 |
| 2012/0275157 | A1* | 11/2012 | Hsu | F21S 4/005 362/249.06 |
| 2012/0327647 | A1* | 12/2012 | Husong | F21S 4/003 362/220 |
| 2013/0021811 | A1* | 1/2013 | Goldwater | F21S 4/005 362/473 |
| 2013/0070452 | A1* | 3/2013 | Urano | H05K 1/181 362/231 |
| 2014/0268779 | A1* | 9/2014 | Sorensen | F21S 4/003 362/249.06 |
| 2015/0085489 | A1 | 3/2015 | Anderson | |

FOREIGN PATENT DOCUMENTS

| | | | | |
|---|---|---|---|---|
| EP | 2447031 | A1 * | 5/2012 | B29C 47/003 |
| GB | 2345954 | A | 7/2000 | |
| JP | H09265807 | A | 10/1997 | |
| JP | 2000173304 | A | 6/2000 | |
| JP | 2001118403 | A | 4/2001 | |
| JP | 2013026053 | A * | 2/2013 | |
| KR | 100794523 | B1 * | 1/2008 | |
| WO | 0124583 | A1 | 4/2001 | |
| WO | 0160119 | A2 | 8/2001 | |
| WO | 2012011279 | A1 | 1/2012 | |
| WO | 2012031533 | A1 | 3/2012 | |

* cited by examiner

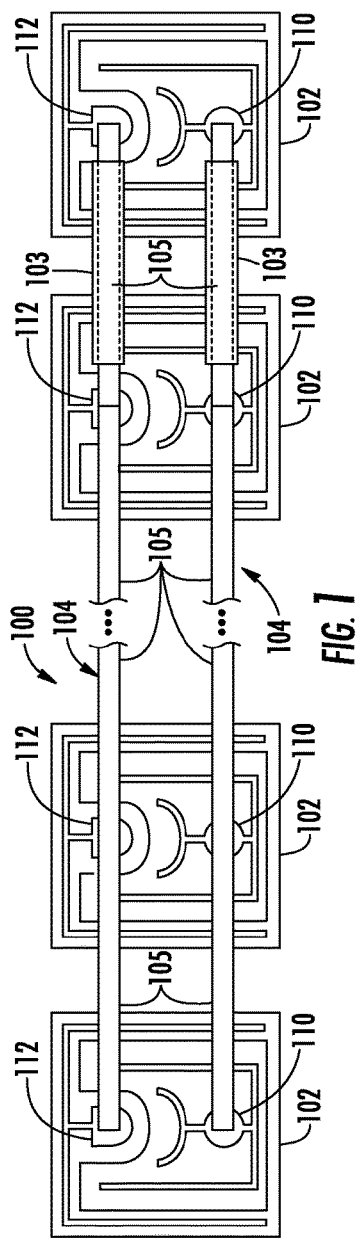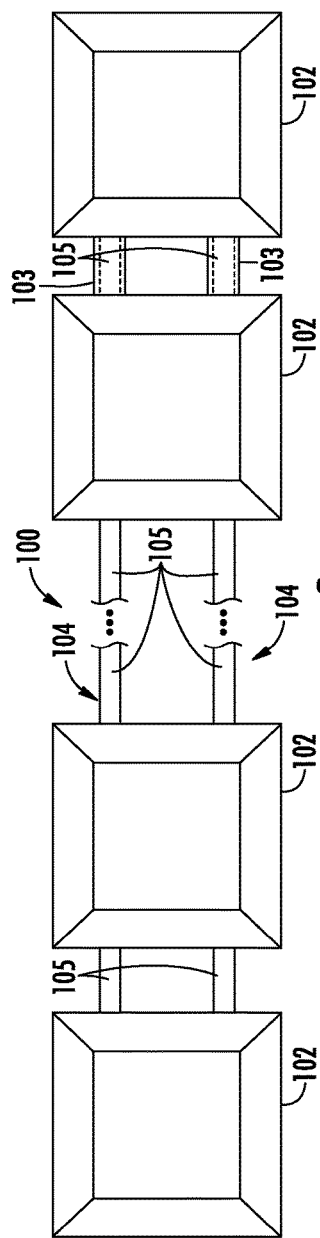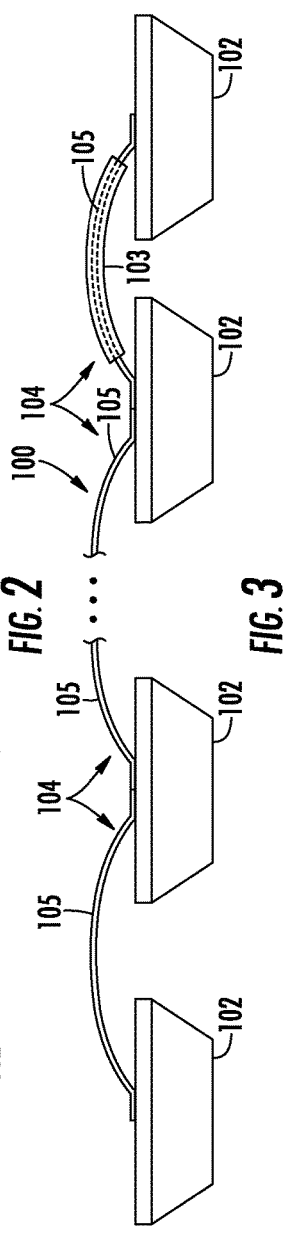

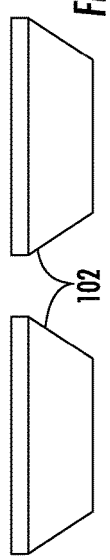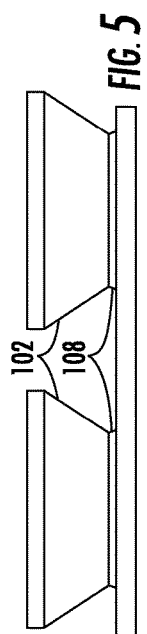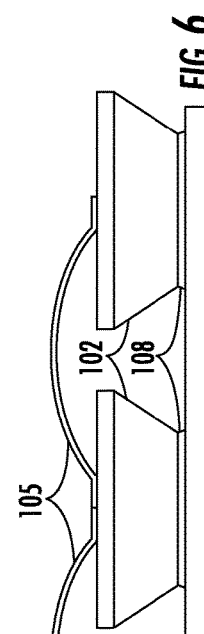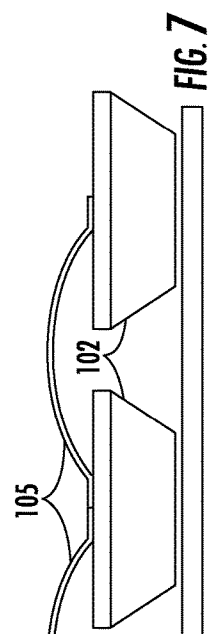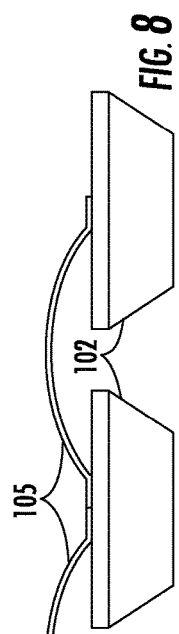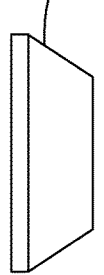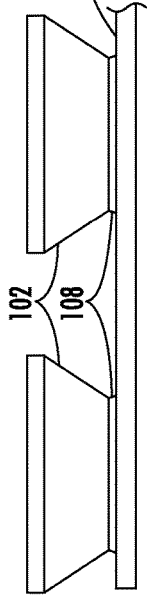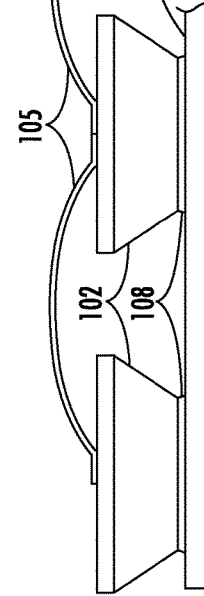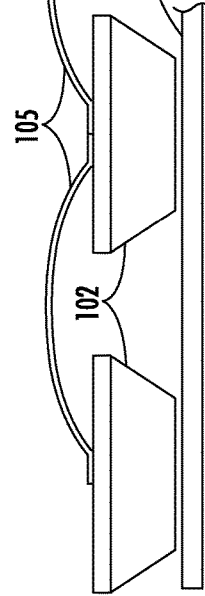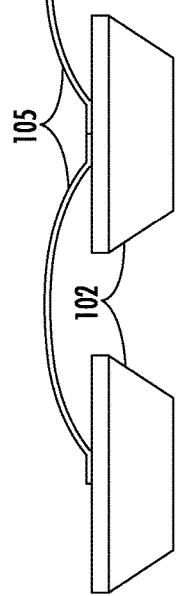

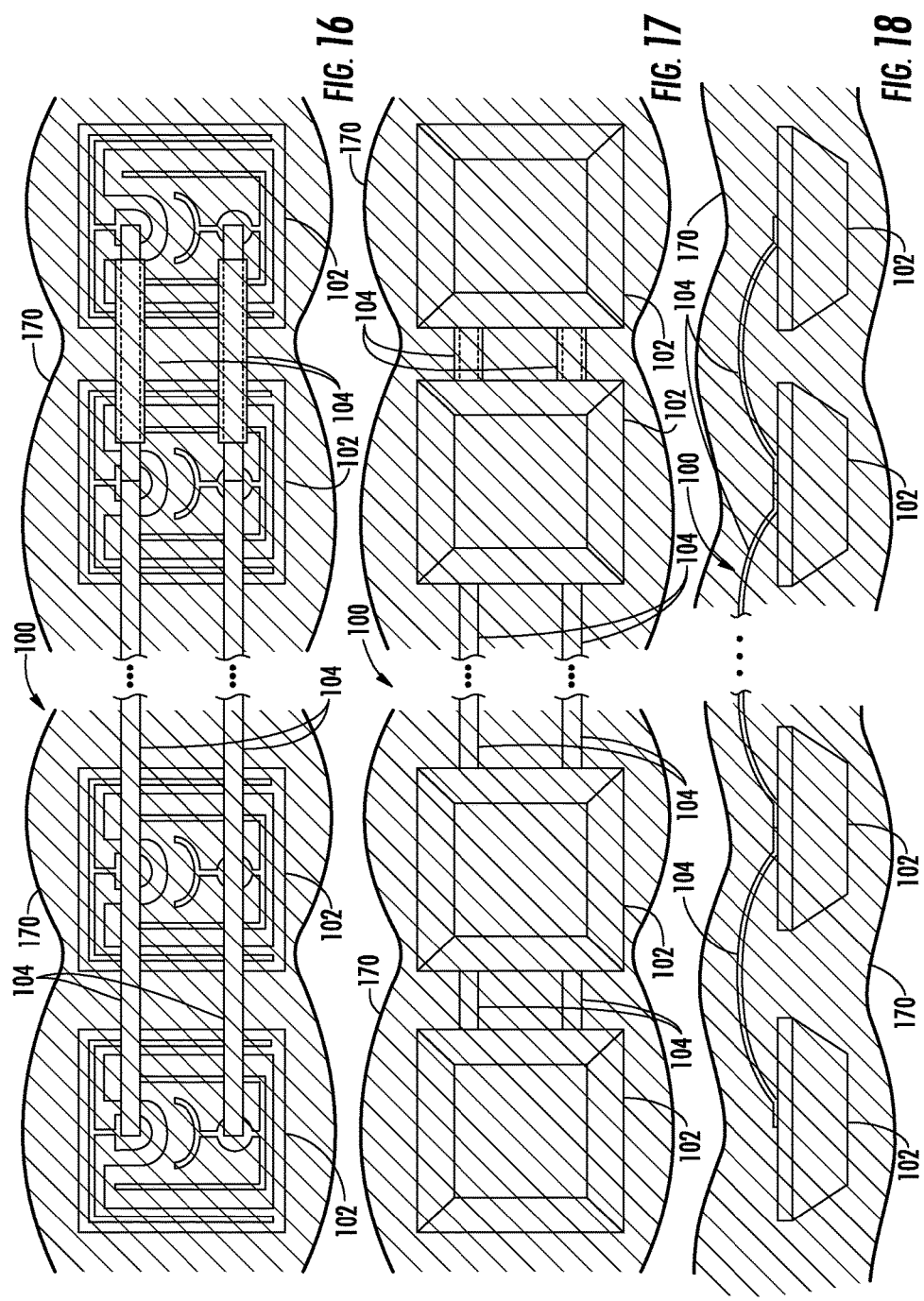

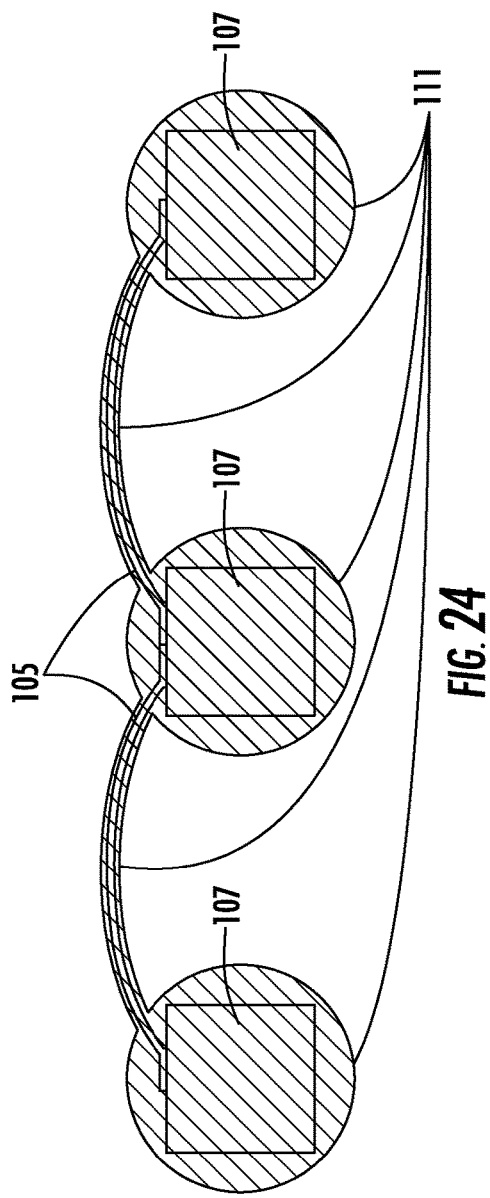
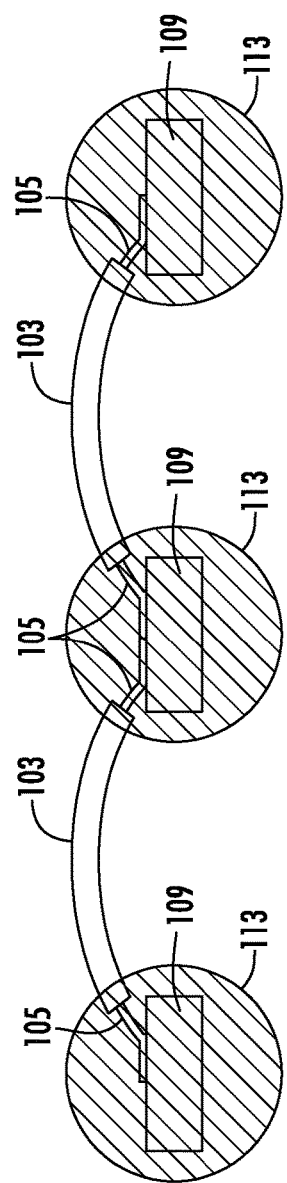

LED ASSEMBLY

BACKGROUND

Light emitting diode (LED) lighting systems are becoming more prevalent as replacements for legacy lighting systems. LED lighting systems are an example of solid state lighting (SSL) and have advantages over traditional lighting solutions such as incandescent and fluorescent lighting because they use less energy, are more durable, operate longer, can be combined in multi-color arrays that can be controlled to deliver virtually any color light, and generally contain no lead or mercury. A solid-state lighting system may take the form of a lighting unit, light fixture, light bulb, luminaire or lamp. Solid state lighting systems may also be used in a variety of other light applications including machinery and industrial, signs, and other lighting applications.

An LED lighting system may include, for example, a packaged light emitting device including one or more light emitting diodes (LEDs), which may include inorganic LEDs, which may include semiconductor layers forming p-n junctions and/or organic LEDs, which may include organic light emission layers. Light perceived as white or near-white may be generated by a combination of red, green, and blue ("RGB") LEDs. Output color of such a device may be altered by separately adjusting supply of current to the red, green, and blue LEDs. Another method for generating white or near-white light is by using a lumiphor such as a phosphor. Still another approach for producing white light is to stimulate phosphors or dyes of multiple colors with an LED source. Many other approaches can be taken. Moreover, light other than white light may also be produced. A heatsink may be used to cool the LEDs and/or power supply in order to maintain appropriate operating temperature.

BRIEF DESCRIPTION OF THE DRAWINGS

FIG. 1 is a top view of an embodiment of a LED assembly of the invention.

FIG. 2 is a bottom view of the LED assembly of FIG. 1.

FIG. 3 is a side view of the LED assembly of FIG. 1.

FIGS. 4 through 8 are views illustrating an embodiment of a method of making the LED assembly of FIG. 1.

FIG. 16 is a top view of another embodiment of a LED assembly of the invention.

FIG. 17 is a bottom view of the LED assembly of FIG. 16.

FIG. 18 is a side view of the LED assembly of FIG. 16.

FIG. 24 is a side view of another embodiment of a LED assembly of the invention.

FIG. 25 is a side view of another embodiment of a LED assembly of the invention.

SUMMARY OF THE INVENTION

Figure 9:
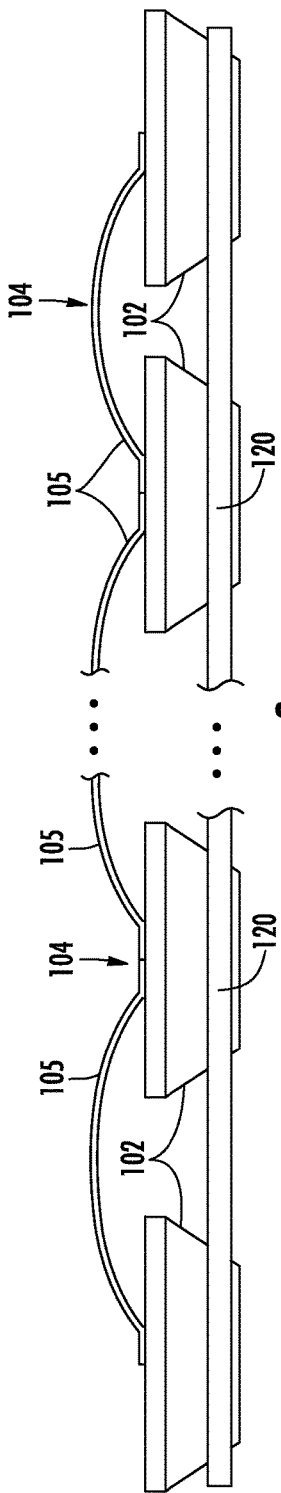
FIG. 9 is a view illustrating an embodiment of an apparatus useful in the method of making the LED assembly of FIG. 1.

In some embodiments, an LED assembly comprises a plurality of LEDs. An electrical connector electrically connects the plurality of LEDs and provides the physical support between the plurality of LEDs.

The electrical connector may comprise a wirebond. The electrical connector may comprise an electrically conductive trace. The plurality of LEDs may comprise an anode and a cathode disposed on one side of the LED where the anode and the cathode are connected to the electrical connector. The plurality of LEDs may comprise an anode and a cathode disposed on different sides of the LED where the anode and the cathode are connected to the electrical connector. The plurality of LEDs may be connected to the electrical connector using at least one of solder and conductive epoxy. The LED assembly may have a three-dimensional shape. The LED assembly may be bent to form the three-dimensional shape. The electrical connector may be bent to form the three-dimensional shape. The electrical connector may comprise electrically conductive wires. The electrically conductive wires may comprise a planar surface where the LEDs are attached to the planar surface. The electrically conductive wires may comprise a plurality of planar surfaces where the plurality of LEDs are attached to the plurality of planar surfaces. The electrical connector and the LEDs may be encapsulated in a phosphor. The phosphor may be pliable. The phosphor may comprise a silicone phosphor. The LEDs and or the electrical connector may be covered in an encapsulant. The electrical connector may be at least partially covered in an insulator. The encapsulant may cover the LEDs and a portion of the insulator to completely isolate the LED assembly from the external environment.

In some embodiments an LED lamp comprises an enclosure where the enclosure is at least partially optically transmissive. A plurality of LEDs are disposed in the enclosure. An electrical connector electrically connects the plurality of LEDs and provides the sole physical support between the plurality of LEDs.

The lamp may comprise an Edison connector. The enclosure may be at least partially reflective. A forced convection air mechanism may be disposed in the enclosure. The enclosure may be filled with a thermally conductive fluid. The LEDs may be thermally coupled to a heat sink.

In some embodiments a method of making an LED assembly comprises attaching a plurality of LEDs to a substrate using a bonding material; connecting an electrical connector between selected ones of the plurality of LEDs; and releasing the bonding material to detach the LEDs from the substrate such that the physical connection between the LEDs is through the electrical connectors. The bonding material may comprise at least one of a silicone epoxy, wax, adhesive and solder. The electrical connectors may comprise wirebonds.

In some embodiments a method of making an LED assembly comprises removably mounting an electrically conductive trace in a fixture; electrically coupling a plurality of LEDs to the electrically conductive trace; removing the electrically conductive trace having the LEDs mounted thereon from the fixture such that the electrically conductive trace electrically connects the plurality of LEDs and physically supports the plurality of LEDs relative to one another. The LEDs may be electrically coupled to the electrically conductive trace using one of solder and conductive epoxy.

DETAILED DESCRIPTION

Embodiments of the present invention now will be described more fully hereinafter with reference to the accompanying drawings, in which embodiments of the invention are shown. This invention may, however, be embodied in many different forms and should not be construed as limited to the embodiments set forth herein. Rather, these embodiments are provided so that this disclosure will be thorough and complete, and will fully convey the scope of the invention to those skilled in the art. Like numbers refer to like elements throughout.

It will be understood that, although the terms first, second, etc. may be used herein to describe various elements, these elements should not be limited by these terms. These terms are only used to distinguish one element from another. For example, a first element could be termed a second element, and, similarly, a second element could be termed a first element, without departing from the scope of the present invention. As used herein, the term "and/or" includes any and all combinations of one or more of the associated listed items.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

Relative terms such as "below" or "above" or "upper" or "lower" or "horizontal" or "vertical" or "top" or "bottom" may be used herein to describe a relationship of one element, layer or region to another element, layer or region as illustrated in the figures. It will be understood that these terms are intended to encompass different orientations of the device in addition to the orientation depicted in the figures.

The terminology used herein is for the purpose of describing particular embodiments only and is not intended to be limiting of the invention. As used herein, the singular forms "a", "an" and "the" are intended to include the plural forms as well, unless the context clearly indicates otherwise. It will be further understood that the terms "comprises" "comprising," "includes" and/or "including" when used herein, specify the presence of stated features, integers, steps, operations, elements, and/or components, but do not preclude the presence or addition of one or more other features, integers, steps, operations, elements, components, and/or groups thereof.

Unless otherwise defined, all terms (including technical and scientific terms) used herein have the same meaning as commonly understood by one of ordinary skill in the art to which this invention belongs. It will be further understood that terms used herein should be interpreted as having a meaning that is consistent with their meaning in the context of this specification and the relevant art and will not be interpreted in an idealized or overly formal sense unless expressly so defined herein.

Unless otherwise expressly stated, comparative, quantitative terms such as "less" and "greater", are intended to encompass the concept of equality. As an example, "less" can mean not only "less" in the strictest mathematical sense, but also, "less than or equal to."

The terms "LED" and "LED chip" as used herein may refer to any solid-state light emitter. The terms "solid state light emitter" or "solid state emitter" may include a light emitting diode, laser diode, organic light emitting diode, and/or other semiconductor device which includes one or more semiconductor layers, which may include silicon, silicon carbide, gallium nitride and/or other semiconductor materials, a substrate which may include sapphire, silicon, silicon carbide and/or other microelectronic substrates, and one or more contact layers which may include metal and/or other conductive materials. A solid-state lighting device produces light (ultraviolet, visible, or infrared) by exciting electrons across the band gap between a conduction band and a valence band of a semiconductor active (light-emitting) layer, with the electron transition generating light at a wavelength that depends on the band gap. Thus, the color (wavelength) of the light emitted by a solid-state emitter depends on the materials of the active layers thereof. In various embodiments, solid-state light emitters may have peak wavelengths in the visible range and/or be used in combination with lumiphoric materials having peak wavelengths in the visible range. Multiple solid state light emitters and/or multiple lumiphoric materials (i.e., in combination with at least one solid state light emitter) may be used in a single device, such as to produce light perceived as white or near white in character. In certain embodiments, the aggregated output of multiple solid-state light emitters and/or lumiphoric materials may generate warm white light output.

Solid state light emitters may be used individually or in combination with one or more lumiphoric materials (e.g., phosphors, scintillators, lumiphoric inks) and/or optical elements to generate light at a peak wavelength, or of at least one desired perceived color (including combinations of colors that may be perceived as white). Inclusion of lumiphoric (also called 'luminescent') materials in lighting devices as described herein may be accomplished by direct coating on solid state light emitter, adding such materials to encapsulants, by embedding or dispersing such materials within lumiphor support elements, and/or coating such materials on lumiphor support elements. Other materials, such as light scattering elements (e.g., particles) and/or index matching materials, may be associated with a lumiphor, a lumiphor binding medium, or a lumiphor support element that may be spatially segregated from a solid state emitter.

Referring to FIGS. 1-3, an embodiment of an LED assembly 100 is shown comprising a plurality of LED chips 102 connected to one another by an electrical connector 104. The electrical connector 104 is electrically conductive and provides the electrical connection between the LEDs 102 to provide current to the LEDs through an electrical path. The electrical path may include the electronics for controlling the operation of the LEDs including the drivers and power supply. In addition to providing critical current to the LEDs, the electrical connector 104 physically supports the LEDs and mechanically connects the LEDs 102 to one another in an LED string or filament. In some embodiments, the electrical connector 104 comprises two electrically conductive paths with one path connecting the anodes of the LEDs and the other path connecting the cathodes of the LEDs. Each path may comprise a single conductive element or a plurality of conductive elements.

Unlike in existing LED systems the LEDs 102 are not mounted on a separate support substrate that provides physical support for the LEDs. In existing LED systems, the LEDs are typically die attached to a substrate such as ceramic ($AL_2O_3$ and AlN being the most common but also including other materials such as ZnO and the like) aluminum, FR4, PCB or the like by epoxy, solder or the like, or in the case of a flip-chip LED bottom side contacts may be connected to metal traces formed on an LED board. The inventor of the present invention has discovered that use of a separate mounting substrate is not required and that the electrical connectors 104 may provide the necessary physical support to connect the LEDs 102 to one another in addition to providing the electrical connection to the LEDs. The elimination of a support substrate from the LED string eliminates problems associated with the use of such a support substrate such as, for example, broadening the point source making secondary optics more difficult, absorption of light energy by the substrate and/or increased cost. It has been discovered that because of the extremely low weight of the LEDs 102 compared to the strength of the electrical connector 104, the connector 104 provides adequate support for the LEDs 102. While in some embodiments the LEDs 102 are LED chips connected and supported by the electrical connector 104, packaged LEDs may also be connected and supported by the LED connectors where the weight of the packaged LEDs compared to the strength of connector 104 is low. The electrical connector 104 may be completely covered, or partially covered, with an insulator 103 comprising an electrically insulating material. The insulating material of insulator 103 may be thermally conductive. The electrical connector 104 may be exposed or partially exposed in various embodiments to facilitate heat transfer from the LEDs. The LEDs 102 may be spaced from one another any suitable distances and the LED string may comprise any number or types of LEDs.

In one embodiment, the electrical connector 104 comprises wirebonds 105 where the wirebonds 105 provide the physical support between the chips 102. To manufacture the LED string shown in FIGS. 1-3, a desired number and types of LEDs are selected to create an LED string having desired light characteristics as shown in FIG. 4. While four LEDs 102 are shown in the figures, a greater or fewer number of LEDs may be used and the LEDs may be arranged in any desired pattern including non-linear patterns. The LEDs 102 are secured to a substrate 106 to provide a desired pattern of the LEDs, to hold the LEDs stable for energy transfer during the wirebonding process, and to assure a good bond between the wirebonds and the LEDs as shown in FIG. 5. Because the substrate 106 does not form part of the finished LED assembly the substrate 106 may comprise any material to which the LEDs 102 may be bonded during the manufacturing process. In some embodiments, the substrate may comprise aluminum or other metal to facilitate the heating of the system during the wirebonding process; however, other materials may be used. The LEDs 102 may be bonded to the substrate 106 using any bonding material 108 that may be released after the wirebonding operation is complete. In one example a silicone epoxy may be used as the bonding material. One suitable silicone epoxy is KJR, sold by Shin-Etsu Chemical Co., Ltd. In other embodiments, other releasable materials may be used to temporarily attach the LEDs 102 to the substrate 106 such as other epoxies, wax, adhesive, solder or the like. Any bonding material 108 may be used that temporarily holds the LEDs 102 in place on substrate 106 during the wirebonding process. In other embodiments, the LEDs may be temporarily held in place by a fixture 120 as shown in FIG. 9.

Once the LEDs are secured in the desired position, the wirebonds 105 are made between the anodes 110 and cathodes 112 on the LEDs 102 (FIG. 1) as shown in FIG. 6. The wirebonds 105 provide the electrical interconnect between the LEDs 102 and power supply to provide critical current to power the LEDs.

The silicone epoxy or other bonding material 108 may be dissolved, melted or otherwise released using a solvent, heat or the like after the wirebonds 105 are formed to release the LEDs 102 from the substrate 106 as shown in FIG. 7. After the LEDs 102 are released from the substrate 106 the LED assembly comprises an LED string where the physical support between the LEDs 102 is made by the electrical connectors 104 without using a separate substrate as shown in FIG. 8. The physical support between the LEDs 102 may be made solely by the electrical connector 104. While wirebonds 105 are disclosed as an example of the electrical connector 104 between the LEDs 102, other methods and devices for making the electrical connection between the LEDs may also be used.

Figure 10:
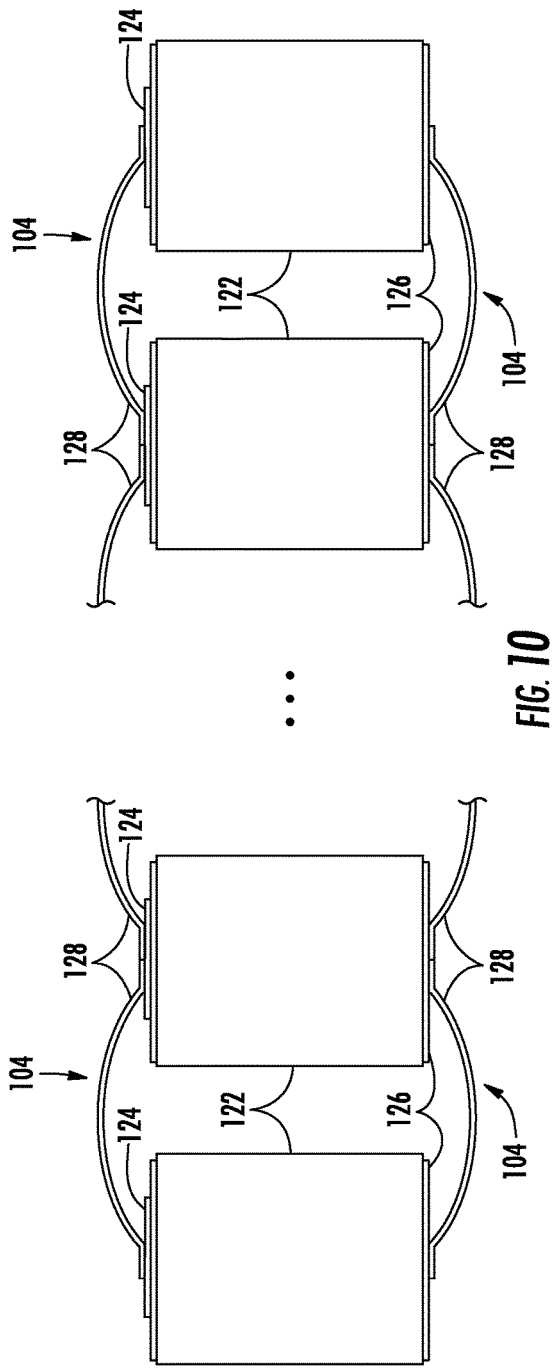
FIG. 10 is a side view of another embodiment of a LED assembly of the invention.

In some embodiments the LEDs 102 used in the formation of the LED string may comprise LED chips having the anode and cathode terminals on the top of the chip where the electrical connector 104 extends from the top of one chip to the top of the adjacent chip as shown in FIGS. 1-9. Suitable chips may be the CREE® TR LED chips, the CREE® TR-M LED chips, sapphire chips, or the like. While specific LED chips are identified, any suitable LED may be used. In other embodiments, LEDs 122 having top and bottom anodes and cathodes 124 and 126, may be assembled into a self-supporting LED string as described herein where the electrical connector 104 such as wirebonds 128 make the electrical connection between the tops and bottoms of the chips as shown in FIG. 10. Suitable chips may be the CREE® RT LED chips. In such a system a fixture for holding the LEDs during assembly of the string may be advantageously used.

In this and in other embodiments, the entire LED string including the LEDs or only the LEDs may be encapsulated to provide optical direction to the light and/or to provide light mixing or uniformity to the emitted light. The encapsulant may comprise silicone or other optically transmissive material. The encapsulant may be provided over the entire LED string in a very thin layer or the encapsulant may be provided only on the LEDs in a miniglob format so that heat conduction from the wirebonds 105 is maximized. FIG. 24 shows an LED string where a thin encapsulating layer 111 is provided over the entire LED string to isolate the LED string from the external environment. FIG. 25 shows and LED string where a miniglob 113 is applied only to the LEDs. If the wirebonds 105 are covered in an insulating material 103 and the miniglob 113 of encapsulant covers the LEDs 109 and extends over the insulating material 103 then the entire LED string is isolated from the external environment. In the embodiments of FIGS. 24 and 25 the LED assembly is waterproof and insulated to thereby enhance robustness of the LED string and to expand potential applications. In FIG. 24 the LEDs 107 are shown as cubed shape sapphire LEDs. In FIG. 25 the LEDs 109 are shown as thin silicone-based LEDs. In some embodiments the encapsulated filament may contain phosphor conversion material to make a white emitting, wavelength adjusted, or wavelength-mixed luminous emission. The LEDs may be any color and/or the LEDs in a single string may be of different colors such as alternating colors with phosphors applied to the encapsulant as desired to achieve the desired color or combinations of colors.

Figure 12:
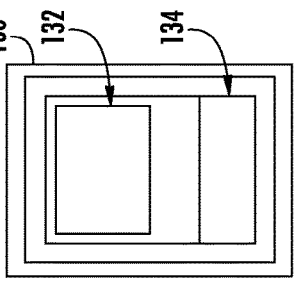
FIG. 12 is a bottom view of the LED of FIG. 11.
Figure 11:
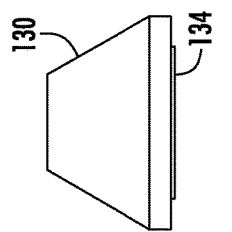
FIG. 11 is a side view of an embodiment of an LED usable in the LED assembly of the invention.
Figure 13:
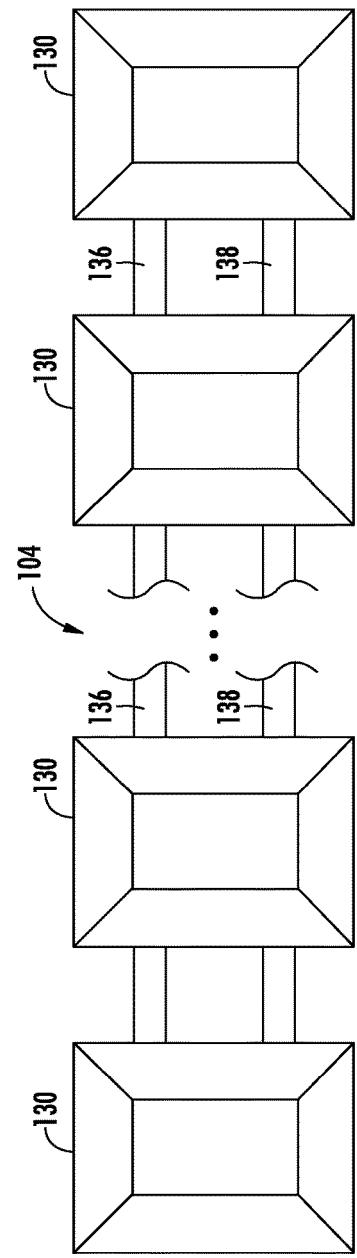
FIG. 13 is a top view of another embodiment of a LED assembly of the invention.

Referring to FIGS. 11-13, in another embodiment, flip-chip LED chips 130 may be used where the LED chip has an anode 132 and a cathode 134 formed on the bottom thereof. The electrical connector 104 comprises electrically conductive metal traces or ribbons (hereinafter "traces") 136 and 138 that are electrically coupled to the anodes 132 and cathodes 134 of LEDs 130, respectively, to electrically couple the LEDs to one another and to provide the mechanical connection between and physical support of the LEDs.

Figure 23:
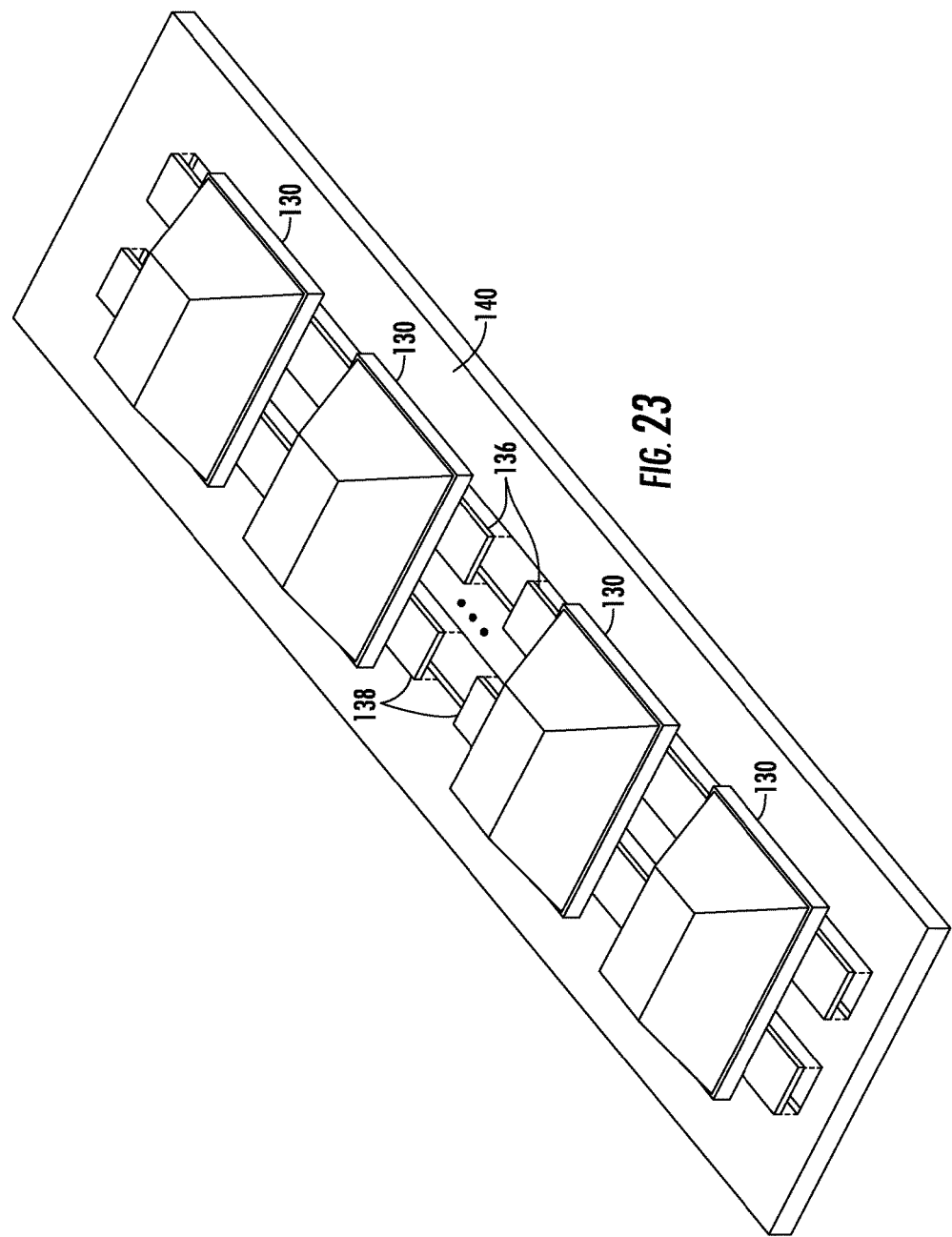
FIG. 23 is an exploded perspective view illustrating an embodiment of a method of making the LED assembly of FIG. 13.

Referring to FIG. 23, to make the LED assembly, electrically conductive metal traces 136 and 138 are removably mounted in a fixture or matrix 140. The anodes 132 and cathodes 134 of LEDs 130 may be fixed to the metal traces 136 and 138, respectively. The LEDs 130 may be fixed to the metal traces 136 and 138 using die solder or conductive epoxy where energy is applied to reflow the solder or cure the epoxy. Other electrically conductive connections may also be used. After the LEDs 130 are affixed to the electrical traces 136 and 138, the traces 136 and 138 having the LEDs 130 mounted thereon are removed from the fixture or matrix 140 such that the traces 136 and 138 electrically connect the LEDs 130 and physically support the LEDs 130 relative to one another. In other embodiments the traces 136, 138 may be fixed to a suitable substrate using a releasable bonding material as previously described. An example of LED flip-chips suitable for use are the CREE® DA LED chips. While specific LED chips are identified, any suitable LED may be used. In another embodiment, the LED flip-chips 130 may be mounted upside down in a desired configuration and fixed in place on a substrate using a releasable bond as described with reference to FIGS. 4-8. The leads 132, 134 of the LEDs 130 may be connected using a point source reflow to make the electrical connector between the LEDs. Once the electrical connectors are formed, the LED chips 130 may be released from the substrate or fixture as previously described to create the LED string.

Figure 14:
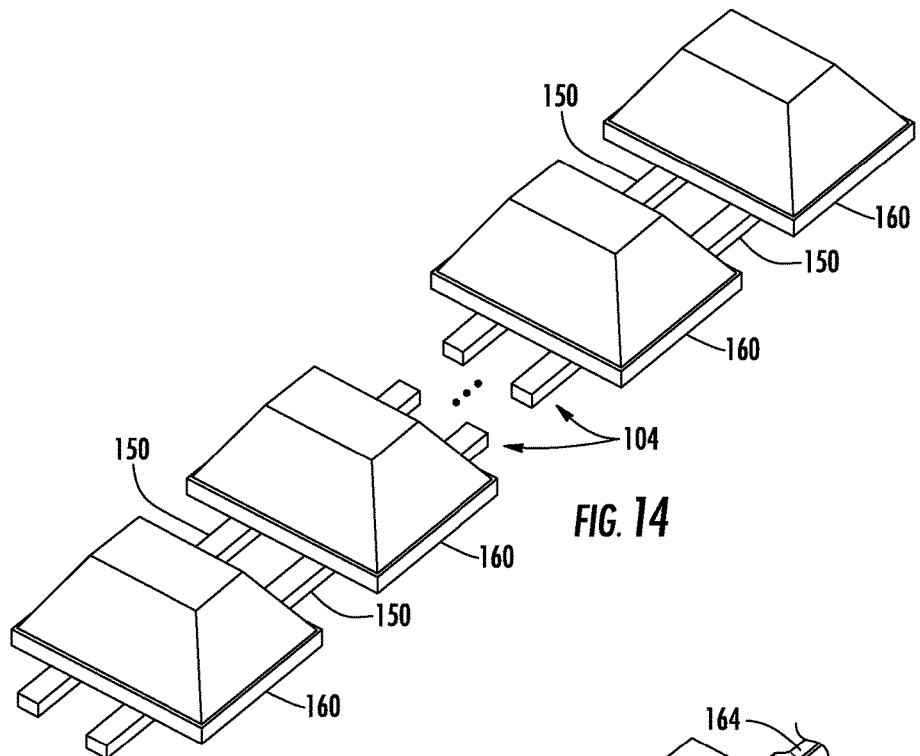
FIG. 14 is a perspective view of another embodiment of a LED assembly of the invention.
Figure 15:
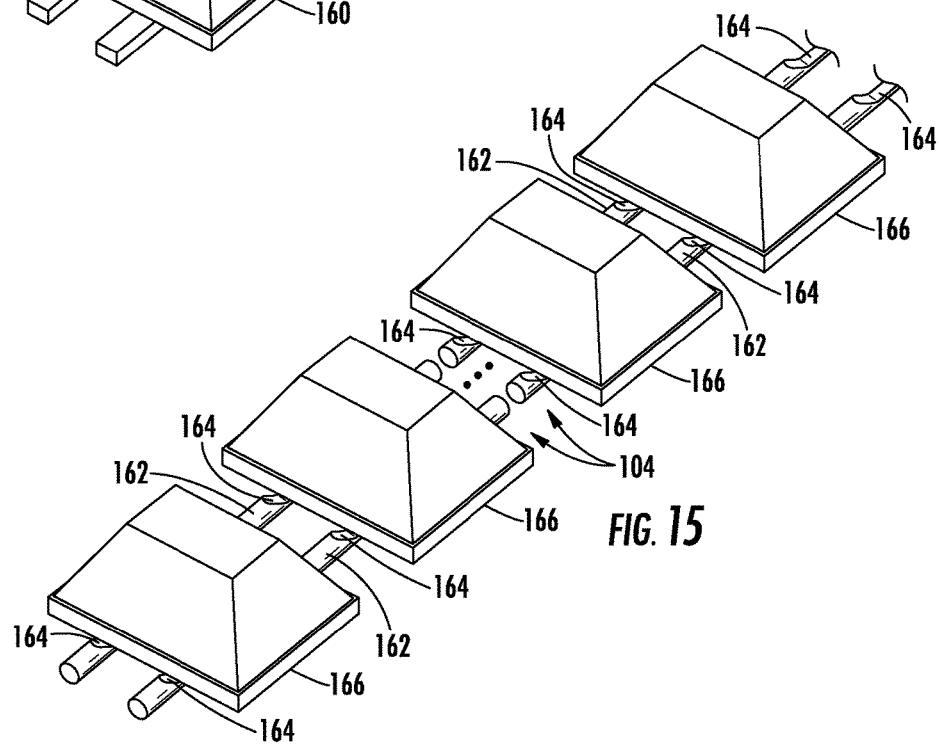
FIG. 15 is a perspective view of yet another embodiment of a LED assembly of the invention.

In another embodiment the electrical connector 104 may comprise electrically conductive elements such as wires, rails or other elongated electrical conductors (hereinafter "wires") where the leads of the LEDs are mounted to the wires such as by soldering, conductive epoxy or the like. Referring to FIG. 14 the wires 150 may comprise an electrically conductive material such as copper that are electrically coupled to the anode and cathodes of the LEDs 160. The wires 150 may be provided with a rectangular cross-section as shown in FIG. 14 to provide a flat surface for connecting to the LEDs 160. Alternatively, the wires may be provided with a single flat surface where the LEDs 160 are mounted to the flat surface of the wires 150. In other embodiments, as shown in FIG. 15, wires 162 having a round cross-section may be used where the wires are stamped or otherwise flattened to provide planar mounting areas 164 for the LEDs 166. While in some embodiments, the LEDs may be mounted to the wires to create an LED string that may then be used in a lighting fixture, lamp, luminaire or the like, in some embodiments the wires may be mounted to a structure such as a ceiling or a wall and the LEDs may be mounted to the wires on site.

In the various embodiments described herein the LED string may be bent at the electrical connectors 104 to form the string into a variety of three-dimensional shapes. A three-dimensional shape as used herein means that the LED string may be formed into a shape where the LEDs are disposed in different planes. For example the LED string may be formed to have a cylindrical or circular shape, a helical shape, a rectilinear shape or other regular or irregular shapes. The LED string may also be used as a linear string where all of the LEDs face in the same direction and are in a single plane.

In some embodiments a phosphor may be used with the LEDs to create a desired emitted light color including white light. The phosphor may be applied to the LEDs and/or the electrical connector 104. In some embodiments, the LED string may be dipped or sprayed to coat the LEDs 102 and the electrical connectors 104 in the phosphor layer 170. The phosphor layer may comprise a pliable matrix made of, for example, a pliable material such as a silicone phosphor as shown in FIGS. 16-18 to allow the LED string to be bent into a desired configuration after it is assembled. The thickness of the phosphor layer 170 is selected to achieve a desired light color and may be on the order of approximately 50 microns. In addition to covering the LEDs in phosphor for color tuning the light, the coating of silicone phosphor over the LEDs 102 and electrical connectors 104 reinforces the connectors 104 while allowing the LED string to bend to a desired shape. The phosphor layer 100 may comprise plural layers of phosphor and may comprise phosphors other than those specifically described herein.

In some embodiments low power LEDs may be used. Low power LEDs as used herein means LEDs operated at approximately 1 Watt or less. Low power LEDs are particularly suitable for such an application because low power LEDs are more efficient and develop less heat than higher power LEDs. Because the LED string as described herein does not use a substrate, the heat dissipation from the LED string may be less than with LEDs mounted on a heat conductive substrate. Low power LEDs may be used with convective cooling because the relatively small LEDs have a large surface area compared to epi area. The LED chips may also be shaped to optimized convection area by increasing the external surface area of the LED.

In other embodiments, a separate physical heat sink may be used to dissipate heat from the LEDs. However, the heat sink may be mounted remotely from the LEDs such that the LEDs are not mounted directly on a substrate. In one embodiment, a thermally conductive member is thermally coupled to the LED string such that heat may be conducted from the LEDs to a remote heat sink via the thermally conductive member. However, because the LED string is made independently of the thermally conductive member the LED string may take any form and shape regardless of the form and shape of the thermally conductive member. Also, because the LED string is only thermally coupled to the thermally conductive member the thermally conductive member may not provide physical support between the LEDs. The LED string may also be mounted to a substrate after the LED string is made. In some embodiments, the substrate may provide additional physical support and thermal coupling for the LEDs.

Figure 19:
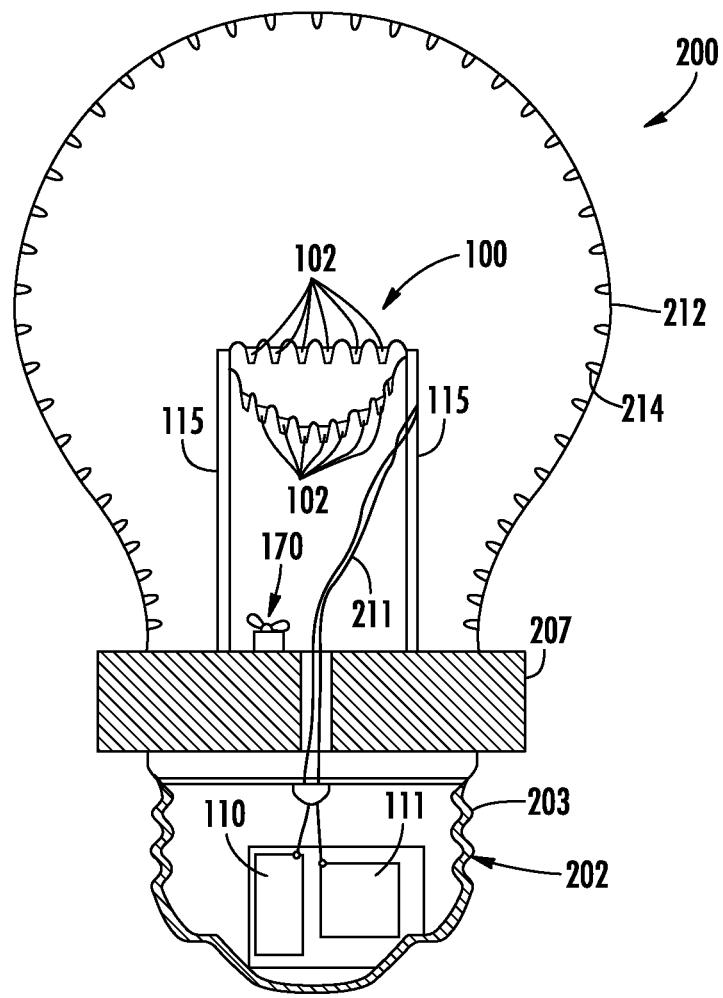
FIG. 19 is a section view of an embodiment of a lamp of the invention.

FIG. 19 shows a lamp, 200, according to some embodiments of the present invention. Lamp 200 comprises a base 202 connected to an optically transmissive enclosure 212. Lamp 200 may be used as an A-series lamp with an Edison base, more particularly; lamp 200 may be designed to serve as a solid-state replacement for an A19 incandescent bulb. The Edison base as shown and described herein may be implemented through the use of an Edison connector 202 and a plastic or metal form 205 that is connected to a heat sink structure 207 (FIG. 20) or the Edison connector 203 may be connected to the heat sink structure 207 without an intervening form 205 (FIG. 19). LEDs 102 in an LED string 100 as described herein are mounted in the enclosure and are operable to emit light when energized through an electrical connection. While a lamp having the size and form factor of a standard-sized household incandescent bulb is shown, the lamp may have other the sizes and form factors. The LEDs may be thermally coupled to the heat sink 207 by thermally conductive members 115 that support the LED string in the enclosure and that transfer heat from the LEDs to the heat sink 207. The heat sink 207 may be mounted such that the LEDs are not mounted directly on a substrate.

Enclosure 212 is, in some embodiments, made of glass, quartz, borosilicate, silicate, polycarbonate, other plastic or other suitable material. The enclosure 212 may be of similar shape to that commonly used in household incandescent bulbs. It should also be noted that the enclosure 212 or a portion of the enclosure could be coated or impregnated with phosphor. The enclosure 212 may be transparent or translucent such that the light emitted into the interior of the enclosure, passes through the enclosure and is emitted from the enclosure. In some embodiments, the enclosure 212 may have a diffuser layer 214 that scatters the light passing through the enclosure to produce a broad beam intensity profile. The diffuser layer may be transparent, semi-transparent, or translucent. In one embodiment, a uniform diffuser layer may be applied to the entire surface of the enclosure 212. In some embodiments, the enclosure 212 is coated on the inside with silica, alumina, titanium dioxide, or other particulate to provide a diffuser scattering layer 214 that produces a more uniform far field pattern. The enclosure 212 may also be etched, frosted or coated. The enclosure may also have the diffuser layer formed as a part of the enclosure rather than applied to the enclosure. For example, the enclosure 212 may be made of a plastic such as acrylic or borosilicate glass where the enclosure material has light scattering properties.

Lamp base 202 includes a connector, such as Edison connector 203, that functions as the electrical connector to connect the lamp 200 to an electrical socket or other connector. Depending on the embodiment, other base configurations are possible to make the electrical connection such as other standard bases or non-traditional bases. Base 202 may include the electronics for powering lamp and may include a power supply 110 and/or driver 111 and form all or a portion of the electrical path between the mains and the LEDs. Electrical conductors 211 run between the LED string and the lamp base 202 to carry both sides of the supply to provide critical current to the LEDs. The lamp electronics are electrically coupled to the Edison screw 203 such that the electrical connection may be made from the Edison screw 203 to the lamp electronics. The Edison screw 203, heat sink 207 and/or base 202 may be potted to physically and electrically isolate and protect the lamp electronics 201.

In one embodiment, the enclosure 212 and base 202 are dimensioned to be a replacement for an ANSI standard A19 bulb such that the dimensions of the lamp 100 fall within the ANSI standards for an A19 bulb. The dimensions may be different for other ANSI standards including, but not limited to, A21 and A23 standards. In some embodiments, the LED lamp 200 may be equivalent to standard watt incandescent light bulbs.

While low power LED chips may be used, high power LED chips may be used in some environments where heat transfer from the LEDs is increased. For example, high and/or low power LEDs may be used in applications where forced convection is used to increase the heat transfer from the LEDs. Using forced convection, air is actively passed over the LED string 100. The air may be moved over the LED string using a forced convection air mechanism 170 such as a rotary fan, diaphragm pump, or the like. The forced convection sufficiently increases the thermal cooling of the LEDs without the need for a separate heat conductive substrate.

Figure 20:
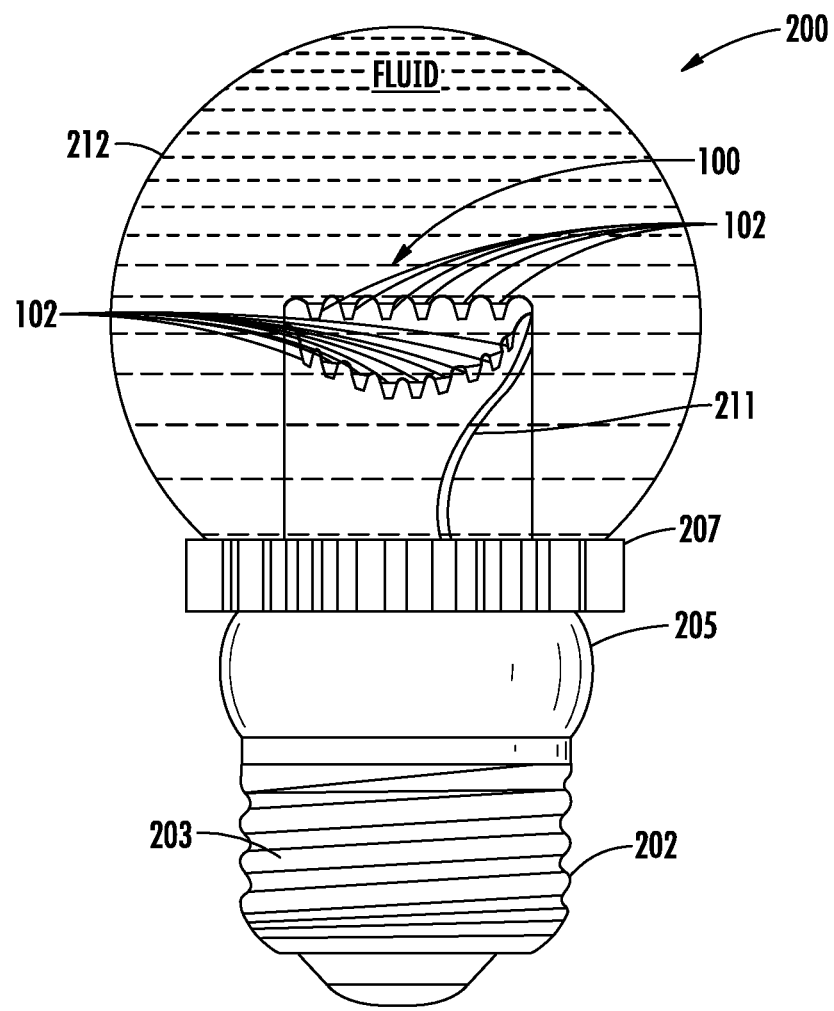
FIG. 20 is a side view of another embodiment of a lamp of the invention.

In other embodiments the LEDs strings may be used with a highly efficient thermally conductive fluid such as a thermally conductive gas or liquid as shown in FIG. 20. For example, the LED string may be mounted in an optically transmissive enclosure where the enclosure is filled with a thermally conductive fluid. For example, a liquid such as mineral oil or a gas such as a non-explosive mixture of hydrogen and/or helium may be used to fill the enclosure. Mineral oil is thermally conductive, inexpensive, clear and optically stable. The thermally conductive fluid transmits heat from the LEDs to the enclosure 212 and heat sink 207 where it is dissipated from the lamp.

Figure 21:
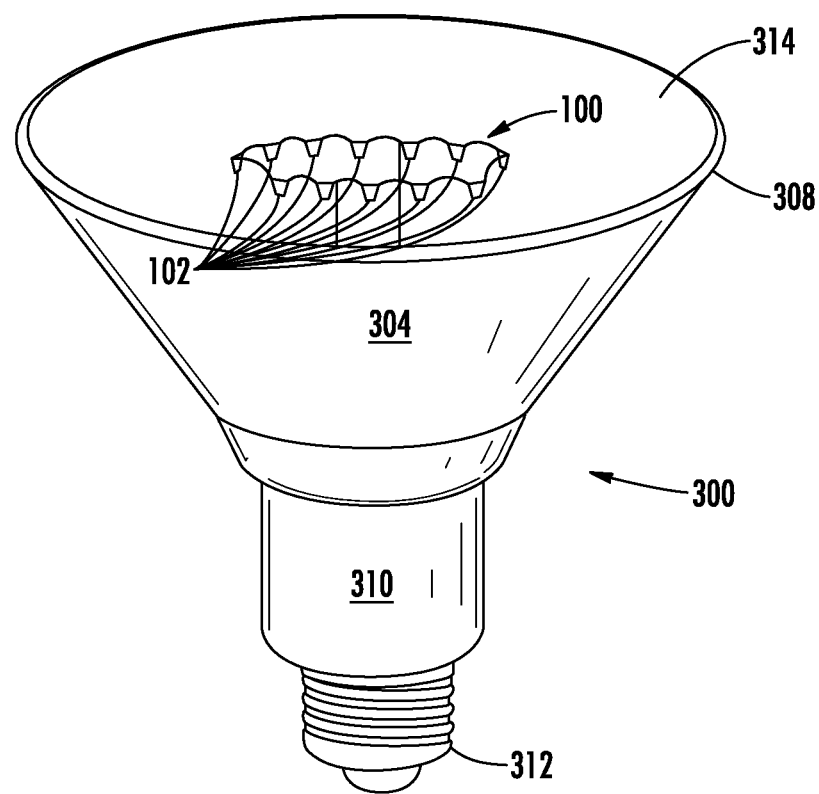
FIG. 21 is a perspective view of another embodiment of a lamp of the invention.

FIG. 21 shows an embodiment of a reflector style lamp 300 such as a replacement for a PAR or BR style bulb. Lamp 300 comprise a base such as an Edison base having an Edison connector 312 connected to a housing 310. The base may comprise the lamp electronics as previously described. The base is connected to a reflector housing 308 having a reflective surface 304 for reflecting light such that it is emitted from the exit surface of the lamp in a desired pattern. Light may be emitted from the lamp through an optically transmissive lens 314. An LED string 100 as described herein may be supported in the enclosure to emit light.

Figure 22:
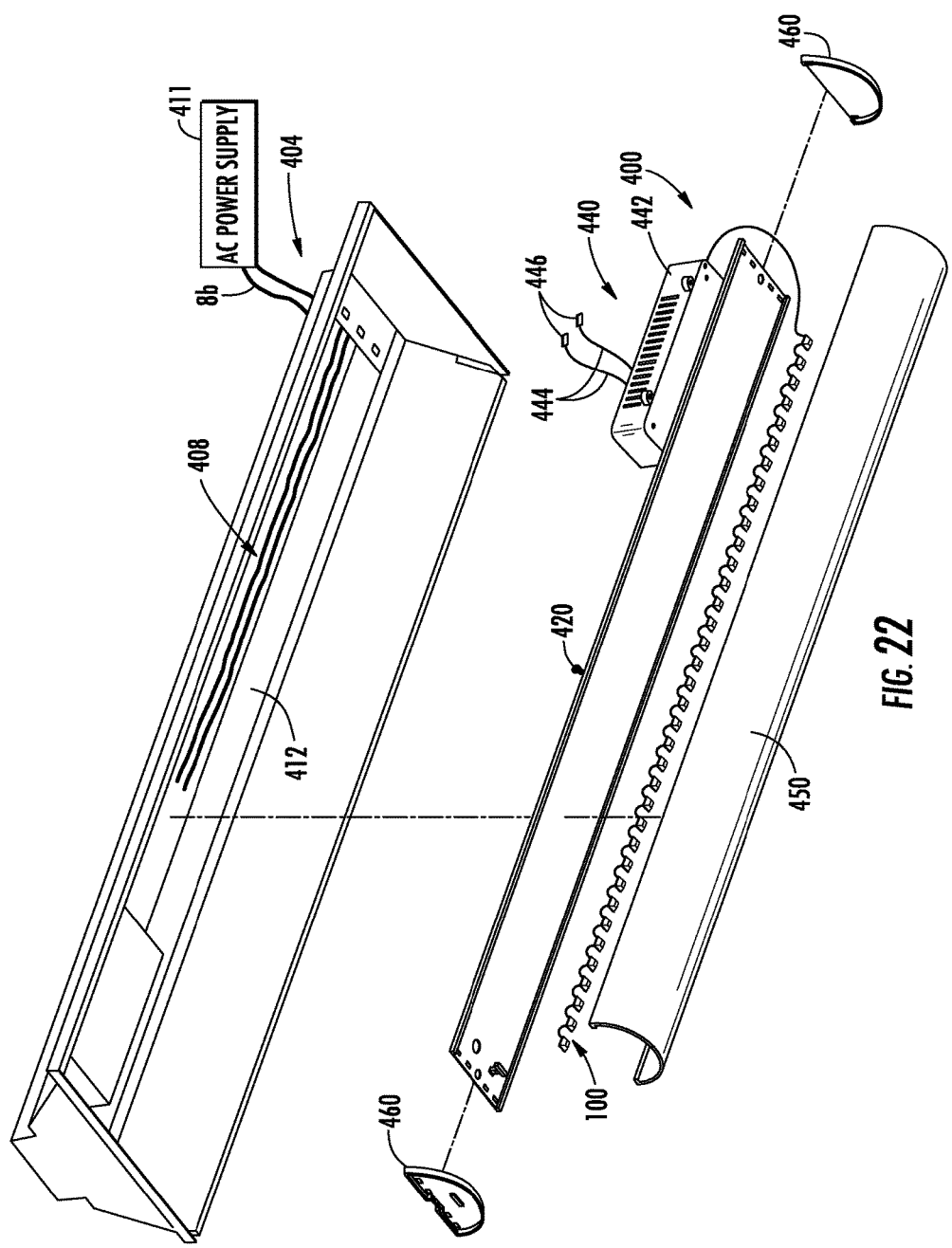
FIG. 22 is an exploded perspective view of another embodiment of a lamp of the invention.

FIG. 22 shows an embodiment of a troffer fixture having a housing 404 that may be recess mounted or flush mounted in a ceiling or other support. While one embodiment of a troffer housing 404 is shown, the troffer housing may comprise a variety of shapes sizes and configurations. The troffer housing 404 typically supports the electrical connection such as wires between the LED string 100 and an AC power supply 411. The AC power supply 411 may be the electrical grid of a building or other structure or the like.

The LED lamp 400 comprises an LED string 100 such as described above that may be supported by and secured to the base 420. The LED string may comprise a plurality of LEDs that extend the length of, or substantially the length of, the base 420 to create a desired light pattern. The LEDs may be arranged such that the light pattern extends the length of, or for a substantial portion of the length of, the troffer fixture and is similar in length to a traditional fluorescent bulb. While in one embodiment the LEDs extend for substantially the entire length of the base, the LEDs may be arranged in other patterns and may extend for less than substantially the entire length of the base if desired. The LEDs may be provided on the base in a wide variety of patterns and may include a wide variety of different types and colors of LEDs to produce light in a wide variety of colors and/or light patterns. The base 420 may be made of a reflective material, e.g., MCPET, white optic, or the like, to reflect light from the mixing chamber. The entire base may be made of a reflective material or portions of the base may be made of reflective material. For example, portions of the base that may reflect light may be made of reflective material.

The power supply, drivers, other electrical circuitry and electrical connectors 440 for powering the LEDs of the LED string may be mounted to the back side of the base 420. These components may be contained in a housing 442 to isolate the components from the external environment. The housing 442 may be dimensioned to fit into the wire way 412 of the troffer housing 404. The power supply comprises electrical connectors 444 for connecting the power supply, driver and other components to the AC power supply. In one embodiment the connectors 444 comprise wires that may connected to the existing AC power supply wires 408. The wires 444 may terminate in electrical connectors 446 or separate electrical connectors may be used to connect the electronics of the LED fixture to the AC power supply 411. The lamp electronics 440 are connected to LEDs 402 to provide an electrical connection between the AC power supply and the LEDs.

A lens 450 may be connected to the base 420 to cover the LED string and create a mixing chamber for the light emitted from the LEDs. The lens 450 diffuses and mixes the light from the LEDs to provide as uniform, diffuse, color mixed light pattern. The lens 450 may be made of molded plastic or other material and may be provided with a light diffusing layer. The light diffusing layer may be provided by etching, application of a coating or film, by the translucent or semitransparent material of the lens, by forming an irregular surface pattern during formation of the lens or by other methods. The lens may be closed by end caps 460.

With respect to the features described above with various example embodiments of a lamp, the features can be combined in various ways. The LEDs may comprise an LED die disposed in an encapsulant such as silicone, and LEDs which may be encapsulated with a phosphor to provide local wavelength conversion. A wide variety of LEDs and combinations of LEDs may be used in as described herein. The LEDs are operable to emit light when energized through an electrical connection. For example, the various methods of including phosphor in the lamp can be combined and any of those methods can be combined with the use of various types of LED arrangements such as bare die vs. encapsulated or packaged LED devices. The embodiments shown herein are examples only, shown and described to be illustrative of various design options for a lamp with an LED array.

LEDs used with an embodiment of the invention and can include light emitting diode chips that emit hues of light that, when mixed, are perceived in combination as white light. Phosphors can be used as described to add yet other colors of light by wavelength conversion. For example, blue or violet LEDs can be used with the appropriate phosphor. LED devices can be used with phosphorized coatings packaged locally with the LEDs or with a phosphor coating the LED die as previously described. For example, blue-shifted yellow (BSY) LED devices, which typically include a local phosphor, can be used with a red phosphor to create substantially white light, or combined with red emitting LED devices in the array to create substantially white light. A lighting system using the combination of BSY and red LED devices referred to above to make substantially white light can be referred to as a BSY plus red or "BSY+R" system. In such a system, the LED devices used include LEDs operable to emit light of two different colors. A further detailed example of using groups of LEDs emitting light of different wavelengths to produce substantially while light can be found in issued U.S. Pat. No. 7,213,940, which is incorporated herein by reference.

Although specific embodiments have been shown and described herein, those of ordinary skill in the art appreciate that any arrangement, which is calculated to achieve the same purpose, may be substituted for the specific embodiments shown and that the invention has other applications in other environments. This application is intended to cover any adaptations or variations of the present invention. The following claims are in no way intended to limit the scope of the invention to the specific embodiments described herein.

The invention claimed is:

1. A method of making an LED assembly comprising:
   securing a plurality of LEDs to a substrate using a bonding material;
   connecting at least one electrical connector between selected ones of the plurality of LEDs;
   releasing the bonding material to detach the LEDs from the substrate such that the physical connection between the selected ones of the plurality of LEDs is solely through the at least one electrical connector.

2. The method of claim 1 wherein the bonding material comprises at least one of a silicone epoxy, wax, adhesive and solder.

3. The method of claim 1 further comprising encapsulating the at least one electrical connector and the plurality of LEDs in a pliable phosphor layer.

4. The method of claim 3 wherein the pliable phosphor layer contains a pliable silicone.

5. The method of claim 1 wherein the at least one electrical connector comprises a wirebond.

6. The method of claim 1 wherein each of the plurality of LEDs comprises an anode and a cathode disposed on a first side of the LED.

7. The method of claim 1 wherein each of the plurality of LEDs comprises an anode disposed on a first side of the LED and a cathode disposed on a second side of the LED.

8. The method of claim 1 further comprising connecting the plurality of LEDs to the at least one electrical connector using at least one of solder and conductive epoxy.

9. The method of claim 1 further comprising forming the LED assembly into a three-dimensional shape.

10. The method of claim 1 further comprising bending the at least one electrical connector to form a three-dimensional shape.

11. The method of claim 1 wherein the at least one electrical connector comprises electrically conductive wires having at least one planar surface and further comprising attaching the plurality of LEDs to the at least one planar surface.

12. The method of claim 1 further comprising applying a pliable phosphor layer to each of the plurality of LEDs.

13. The method of claim 1 further comprising covering the at least one electrical connector in insulation.

14. A method of making an LED assembly comprising:
   removably mounting an electrically conductive trace in a fixture;
   electrically coupling a plurality of LEDs to the electrically conductive trace;
   removing the electrically conductive trace having the plurality of LEDs mounted thereon from the fixture such that the electrically conductive trace electrically connects the plurality of LEDs and the physical connection between the plurality of LEDs is solely through the electrically conductive trace.

15. The method of claim 14 wherein the plurality of LEDs are electrically coupled to the electrically conductive trace using one of die solder and conductive epoxy.

16. The method of claim 14 further comprising encapsulating the at least one electrically conductive trace and the plurality of LEDs in a pliable phosphor layer.

17. The method of claim 16 further comprising bending the at least one electrically conductive trace to form a three-dimensional shape.

18. The method of claim 14 wherein each of the plurality of LEDs comprises an anode and a cathode disposed on a first side of the LED.

19. The method of claim 14 further comprising bending the at least one electrically conductive trace to form a three-dimensional shape.

20. The method of claim 14 further comprising applying a pliable phosphor layer to each of the plurality of LEDs.

* * * * *